US012761292B2

(12) United States Patent
Sit et al.

(10) Patent No.: US 12,761,292 B2
(45) Date of Patent: Oct. 13, 2026

(54) SYSTEMS AND METHODS FOR AUTOMATIC MAGNETIC VARIATION DETECTION

(71) Applicant: THE BOEING COMPANY, Arlington, VA (US)

(72) Inventors: Ethan Sit, Seattle, WA (US); Geun I. Kim, Bothell, WA (US); Gang Feng, Bellevue, WA (US); Theresa J. Hirsch, Laguna Niguel, CA (US)

(73) Assignee: THE BOEING COMPANY, Arlinton, VA (US)

( * ) Notice: Subject to any disclaimer, the term of this patent is extended or adjusted under 35 U.S.C. 154(b) by 204 days.

(21) Appl. No.: 18/350,166

(22) Filed: Jul. 11, 2023

(65) Prior Publication Data

US 2025/0020738 A1 Jan. 16, 2025

(51) Int. Cl.
*G01R 33/02* (2006.01)
*G01C 21/20* (2006.01)

(52) U.S. Cl.
CPC ............ *G01R 33/02* (2013.01); *G01C 21/20* (2013.01)

(58) Field of Classification Search
CPC ........ G01R 33/02; G01C 21/20; G01C 21/08; G01C 21/06; G08G 5/21; G08G 5/26; G08G 5/54
See application file for complete search history.

(56) References Cited

U.S. PATENT DOCUMENTS

| | | | | |
|---|---|---|---|---|
| 9,257,048 | B1 * | 2/2016 | Offer | G08G 5/21 |
| 2009/0319178 | A1 * | 12/2009 | Khosravy | G06Q 30/0241 701/408 |
| 2010/0228612 | A1 * | 9/2010 | Khosravy | G06Q 30/02 705/26.1 |
| 2013/0338910 | A1 * | 12/2013 | Vilaplana | G08G 5/727 701/122 |
| 2015/0066870 | A1 * | 3/2015 | Romatka | G06F 16/215 707/690 |
| 2020/0182619 | A1 * | 6/2020 | Boelter | G01C 21/165 |
| 2020/0285828 | A1 * | 9/2020 | Virepinte | H01Q 21/30 |

OTHER PUBLICATIONS

AERO Magazine, Boeing, Q4—2009, 32 pp. 1-32.
Anonymous: Airport Runway Names Shift with Magnetic Field : News : National Centers for Environmental Information (NCEI) II, May 25, 2021, pp. 1-5.

(Continued)

*Primary Examiner* — Alvaro E Fortich
(74) *Attorney, Agent, or Firm* — Moore IP Law

(57) ABSTRACT

Systems and methods for automatic magnetic variation detection include receiving, from a magnetic variation database, first magnetic variation data associated with an airport; determining second magnetic variation data based on a published approach associated with the airport and one or more trajectory measurements as an aircraft flies along a centerline of a localizer signal of the airport; determining a difference between the first magnetic variation data and the second magnetic variation data; and if the difference satisfies a deviation threshold, updating the magnetic variation database based at least on the second magnetic variation data.

20 Claims, 4 Drawing Sheets

(56) References Cited

OTHER PUBLICATIONS

Anonymous: "General Planning", DoD Flight Information Publication, Jan. 1, 2020 (Jan. 1, 2020), XP093132127, Retrieved from the Internet: URL:https://www.cnatra.navy.mil/assets-glo bal/docs/general-planning-20200102.pdf, pp. 1-41.
Extended European Search Report for application No. 24186748.0 dated Nov. 15, 2024, pp. 1-7.
Miressi M Jed—Institute of Electrical and Electronics Engineers: "Magnetic Variation: a Primitive Concept and Its Hold On Contemporary Navigation", 500 Years After Columbus—Navigation Challenges of Tomorrow. Monterey, CA., Mar. 23-27, 1992; [Proceedings of the Position Location and Navigation Symposium (Plans)], New York, IEEE, US, vol. Jan. 1, 1992, pp. 357-361.
Xiaoyang Yang et al.: "Research on modelling and database construction of supporting magnetic variation data and atmospheric data for flight management system simulation", 2017 IEEE International Conference On Information and Automation (ICIA), IEEE, Jul. 18, 2017, pp. 971-976.

* cited by examiner

SYSTEMS AND METHODS FOR AUTOMATIC MAGNETIC VARIATION DETECTION

FIELD OF THE DISCLOSURE

The subject disclosure is generally related to systems and methods for automatic magnetic variation detection.

BACKGROUND

With ever increasing air traffic, safe, efficient aircraft management becomes increasingly important. One aspect of aircraft management includes the ability of aircraft to operate in suboptimal conditions such as bad weather. For example, aircraft can employ an instrument landing system ("ILS") to aid the crew in safely landing the aircraft without the aid of optimal visual cues. One aspect of ILS that ensures safe operation is magnetic variation ("magvar") data that alerts the crew to differences between magnetic north and true north at a particular location due to variations in the earth's magnetic field.

Magvar data can be stored, tracked, and updated, at various points in the aircraft management ecosystem. Communication among these various points may be limited, however, leaving individual aircraft to rely on outdated and potentially inaccurate data. Because aircraft crews use magvar data for ILS approaches in suboptimal conditions, outdated and/or inaccurate magvar data adversely impacts the safety and efficacy of these types of operations.

SUMMARY

In a particular implementation, a method includes receiving, from a magnetic variation database, first magnetic variation data associated with an airport. The method also includes determining second magnetic variation data based on a published approach associated with the airport and one or more trajectory measurements as an aircraft flies along a centerline of a localizer signal of the airport. The method also includes determining a difference between the first magnetic variation data and the second magnetic variation data. The method also includes, if the difference satisfies a deviation threshold, updating the magnetic variation database based at least on the second magnetic variation data.

In another particular implementation, a device includes one or more processors configured to receive, from a magnetic variation database, first magnetic variation data associated with an airport. The one or more processors are further configured to determine second magnetic variation data based on a published approach associated with the airport and one or more trajectory measurements as an aircraft flies along a centerline of a localizer signal of the airport. The one or more processors are further configured to determine a difference between the first magnetic variation data and the second magnetic variation data. The one or more processors are further configured to, if the difference satisfies a deviation threshold, update the magnetic variation database based at least on the second magnetic variation data.

In another particular implementation, a non-transitory computer-readable medium stores instructions that, when executed by one or more processors, cause the one or more processors to receive, from a magnetic variation database, first magnetic variation data associated with an airport. The instructions further cause the one or more processors to determine second magnetic variation data based on a published approach associated with the airport and one or more trajectory measurements as an aircraft flies along a centerline of a localizer signal of the airport. The instructions further cause the one or more processors to determine a difference between the first magnetic variation data and the second magnetic variation data. The instructions further cause the one or more processors to, if the difference satisfies a deviation threshold, update the magnetic variation database based at least on the second magnetic variation data.

In another particular implementation, a device includes means for receiving, from a magnetic variation database, first magnetic variation data associated with an airport. The device also includes means for determining second magnetic variation data based on a published approach associated with the airport and one or more trajectory measurements as an aircraft flies along a centerline of a localizer signal of the airport. The device also includes means for determining a difference between the first magnetic variation data and the second magnetic variation data. The device also includes, if the difference satisfies a deviation threshold, means for updating the magnetic variation database based at least on the second magnetic variation data.

The features, functions, and advantages described herein can be achieved independently in various implementations or can be combined in yet other implementations, further details of which can be found with reference to the following description and drawings.

DETAILED DESCRIPTION

Figure 1:
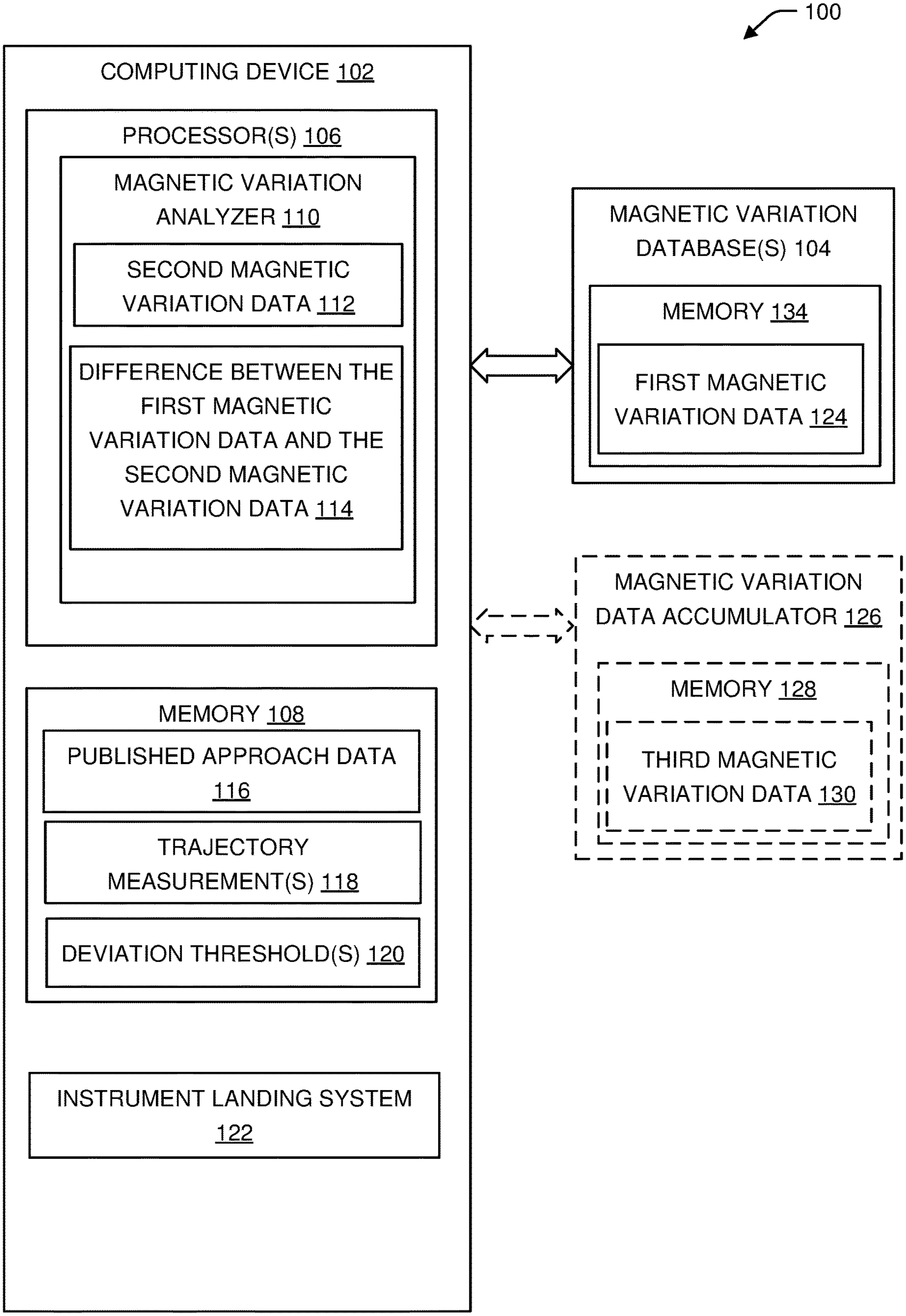
FIG. 1 depicts an example system for automatic magnetic variation detection, in accordance with some examples of the subject disclosure.

Magnetic variation generally refers to the angular difference between true north and magnetic north at a specific location on the Earth's surface. True north is the direction toward the Earth's geographic North Pole, while magnetic north is the direction toward the North Magnetic Pole. The Earth's magnetic field is not uniform, and the non-uniformity changes over time. Thus, the angle between magnetic north and true north varies depending on the location on Earth.

Aircraft navigation traditionally relies on magnetic compasses to determine headings and directions. Since magnetic north is not aligned with true north, pilots must account for the magnetic variation to ensure accurate navigation. Using magnetic variation, pilots can convert between magnetic headings (as indicated by a compass) and true headings (relative to true north). This conversion allows pilots to plot accurate flight routes, calculate wind corrections, and communicate positions effectively.

Magnetic variation plays a role in instrument-assisted landings, specifically when using an ILS, which guides aircraft during the final stages of landing. The ILS consists of two main components: a localizer and a glide slope. The localizer provides lateral guidance, ensuring the aircraft is aligned with the centerline of the runway, while the glide slope provides vertical guidance, ensuring the aircraft maintains the correct descent path. The localizer and glide slope signals are referenced to magnetic north to provide accurate guidance to the aircraft. The system is calibrated to provide precise headings and descent angles based on the magnetic variation at the specific location where the instrument landing system is installed. Flight crew approaching an airport using ILS can use magnetic variation information about the airport and published information about the orientation of the runway of the airport to align the aircraft with the ILS signal.

Some aircraft operate with on-aircraft data sources for magnetic variation data, which can be out-of-date and inaccurate. Updating on-aircraft data sources can require maintenance with specialized equipment, reducing the ability to keep the data up-to-date, and reducing the frequency at which the magnetic variation data is updated.

The systems and methods of the subject disclosure leverage existing onboard computing resources and operational parameters to generate accurate, up-to-date magnetic variation data for an aircraft's specific location as well as, in some implementations, the ability to accumulate and analyze magnetic variation measurements from a plurality of aircraft to maintain a more accurate database of localized magnetic variation data.

A technical advantage of the subject disclosure is the ability to update local magnetic variation data automatically and accurately for use in ILS approaches. The subject disclosure can also allow for accumulation and validation of a larger sample of local magnetic variation data, resulting in more accurate, up-to-date magnetic variation data than reliance on a single measurement. The accumulated data can then be communicated to aircraft for future use in ILS approaches.

The figures and the following description illustrate specific exemplary embodiments. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific embodiments or examples described below, but by the claims and their equivalents.

Particular implementations are described herein with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. Further, some features described herein are singular in some implementations and plural in other implementations. To illustrate, FIG. 1 depicts a system 100 including one or more processors ("processor(s)" 106 in FIG. 1), which indicates that in some implementations the system 100 includes a single processor 106 and in other implementations the system 100 includes multiple processors 106. For ease of reference herein, such features are generally introduced as "one or more" features and are subsequently referred to in the singular or optional plural (as indicated by "(s)") unless aspects related to multiple of the features are being described.

The terms "comprise," "comprises," and "comprising" are used interchangeably with "include," "includes," or "including." Additionally, the term "wherein" is used interchangeably with the term "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

As used herein, "generating," "calculating," "using," "selecting," "accessing," and "determining" are interchangeable unless context indicates otherwise. For example, "generating," "calculating," or "determining" a parameter (or a signal) can refer to actively generating, calculating, or determining the parameter (or the signal) or can refer to using, selecting, or accessing the parameter (or signal) that is already generated, such as by another component or device. As used herein, "coupled" can include "communicatively coupled," "electrically coupled," or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components.

FIG. 1 depicts an example system 100 for automatic magnetic variation detection, in accordance with some examples of the subject disclosure. In some implementations, the system 100 includes a computing device 102 configured to communicate with one or more magnetic variation databases 104.

In some implementations, the magnetic variation database(s) 104 can include, correspond to, or be included within an electronic device that includes a memory 134 storing first magnetic variation data 124. In some aspects, the magnetic variation database(s) 104 can be on board an aircraft. The magnetic variation database(s) 104 can include a plurality of magnetic variation data associated with a respective plurality of geographic points (e.g., airports) for communication to the computing device 102. For example, the first magnetic variation data 124 can include one or more data points indicative of the magnetic variation at a particular geographic point, such as a particular airport.

In some aspects, the magnetic variation database(s) 104 can have a granularity that defines the level of detail at which data is stored at the magnetic variation database(s) 104. For example, data can be stored as integer values (e.g., 0, 1, 2, etc.), one significant digit floating point values (e.g., 0.0, 0.5, 1.0, 1.2, etc.), two significant digit floating point values, etc. The level of detail at which data is stored at the magnetic variation database(s) 104 can reflect the level of detail at which the change in information associated with the data in the magnetic variation database(s) 104 becomes significant. For example, a design choice to have a database with an integer-level granularity can be associated with a choice to ignore changes in data values that cannot be reflected with integers. To illustrate, integer-level granularity can lose the information associated with a difference of 1.1 degrees and 1.2 degrees, which may both be stored as one degree. In a particular aspect of the subject disclosure, the magnetic variation database(s) 104 can have a granularity within an inclusive range of 0.5-1.0 degrees. For example, if the granularity of the magnetic variation database 104 was 0.5 degrees, the first magnetic variation data 124 can be stored in increments of 0.5 degrees (e.g., 0 degrees, 0.5 degrees, 1.0 degrees, 1.5 degrees, etc.).

In some implementations, the computing device 102 can be configured to receive, from the magnetic variation database(s) 104, first magnetic variation data 124 associated with an airport. The computing device 102 can include one or more processors 106 coupled to a memory 108 that includes instructions that, when executed by the processor(s) 106, cause the processor(s) 106 to execute certain functions such as those detailed below.

The processor(s) 106 can include one or more components configured to execute one or more of those functions, including a magnetic variation analyzer 110. In some implementations, the magnetic variation analyzer 110 can be configured to determine second magnetic variation data 112 based on a published approach associated with the airport and one or more trajectory measurements 118 as an aircraft flies along a centerline of a localizer signal of the airport, as described in more detail below and with reference to FIG. 2. In some aspects, data associated with the published approach can be stored as published approach data 116, which can be stored at the memory 108 along with, in some aspects, the trajectory measurement(s) 118.

The magnetic variation analyzer 110 can also be configured to determine a difference 114 between the first magnetic variation data 124 and the second magnetic variation data 112. If the difference 114 satisfies a deviation threshold 120, the magnetic variation analyzer 110 can also be configured to update the magnetic variation database(s) 104 based at least on the second magnetic variation data 112. In some aspects, the deviation threshold 120 is associated with the granularity of the magnetic variation database 104. As noted above, the granularity of the magnetic variation database(s) 104 can be associated with an acceptable loss of information. Associating the deviation threshold 120 with the granularity of the magnetic variation database(s) 104 can allow the electronic device 102 to confirm that the difference 114 between the first magnetic variation data 124 and the second magnetic variation data 112 is significant enough to require an update to the magnetic variation database(s) 104. In a particular aspect, the deviation threshold 120 is within an inclusive range of 0.5-1.0 degrees. For example, if the granularity of the magnetic variation database 104 is 0.5 degrees, the deviation threshold 120 can also be at 0.5 degrees.

In some aspects, the processor 106 can optionally be in communication with an instrument landing system 122. In such aspects, the processor 106 can be configured to use the second magnetic variation data 112 to initiate an instrument landing system approach to the airport during a subsequent flight of the aircraft using the instrument landing system 122. In some aspects, the instrument landing system 122 can include or otherwise incorporate some or all of the components of the electronic device 102. In the same or alternative aspects, some or all of the components of the instrument landing system 122 can be located in a different electronic device.

In some implementations, the computing device 102 can optionally be configured to communicate with one or more magnetic variation data accumulators 126. The magnetic variation data accumulator 126 can be an electronic device that includes a memory 128 storing third magnetic variation data 130. In some aspects, the computing device 102 can be configured to communicate the second magnetic variation data 112 to the magnetic variation data accumulator 126. In such aspects, the magnetic variation data accumulator 126 can be configured to accumulate second magnetic variation data 112 with additional magnetic variation data received from one or more additional aircraft.

The computing device 102 can also be optionally configured to receive the third magnetic variation data 130 from the magnetic variation data accumulator 126. The third magnetic variation data 130 can be based at least on a statistical analysis of the second magnetic variation data 112 and the additional magnetic variation data. The computing device 102 can also be optionally configured to update the magnetic variation database(s) 104 based at least on the third magnetic variation data 130.

In operation, an aircraft on approach to an airport can use an ILS for an instrument-assisted landing. As part of planning for the approach, the computing device 102 will receive the first magnetic variation data 124 associated with the airport from the magnetic variation database 104. The first magnetic variation data can indicate, as an illustrative example, that magnetic north differs from true north by 2.0 degrees at this airport.

The published approach data 116 associated with the airport can indicate the headings on which the aircraft should attempt a particular approach at the airport. In addition to the published approach data 116, the computing device 102 can take one or more trajectory measurements 118 as the aircraft flies along a centerline of a localizer signal of the airport. For example, the published approach data 116 can include data indicating the published magnetic variation (e.g., 1.0 degrees) at the airport. The trajectory measurements 118 can include compass measurements indicating a magnetic heading for the aircraft, inertial measurement unit readings, or some combination thereof. Based on the published approach data 116 and the trajectory measurements 118, the computing device 102 can be configured to determine the second magnetic variation data 112.

In the illustrative example, an aircraft attempting an ILS approach at a particular airport may be instructed to land on a runway designated 22. Information for the designated runway may be obtained from the published approach data 116, which may indicate, for example, that runway 22 is oriented at 217 degrees relative to true North. The aircraft can also receive, from the magnetic variation database 104, the first magnetic variation data 124 indicating that the magnetic variation at the airport is +2.0 degrees. Thus, based on this information, the aircraft would expect the localizer signal centerline to be directed along a direction 219 degrees relative to a local compass reading. As the aircraft approaches the airport, the ILS can acquire the localizer signal, and, using the localizer signal, find the centerline of runway 22. As the aircraft flies along the centerline of the localizer signal, the trajectory measurements 118 can indicate that the aircraft is on a particular magnetic heading that is different from the expected 219 degrees relative to a local compass reading. To illustrate, the centerline of the localizer signal can be at 220 degrees relative to a local compass reading indicating +3.0 degrees deviation from true North. In this example, the +3.0 degree deviation represents the second magnetic variation data 112. The computing device 102 can be configured to determine the difference 114 between the first magnetic variation data 124 (e.g., +2.0 degrees) and the second magnetic variation data 112 (e.g., +3.0 degrees). In this example, the difference is 1.0 degrees.

If the difference satisfies the deviation threshold 120, the computing device 102 updates the magnetic variation database 104 based at least on the second magnetic variation data 112. In the illustrative example, if the granularity of the magnetic variation database 104 is 0.5 degrees and the deviation threshold 120 is correspondingly 0.5 degrees, then the difference of 1.0 degrees satisfies the deviation threshold 120, and the computing device 102 will update the magnetic variation database 104 with the second magnetic variation data 112. In some implementations, the updated data (e.g., 3.0 degrees magnetic variation data rather than 2.0 degrees magnetic variation) can be used to initiate an ILS approach to the airport during a subsequent flight of the aircraft.

In some operations, the computing device 102 can optionally be configured to communicate the second magnetic variation data 112 to the magnetic variation data accumulator 126. The magnetic variation data accumulator 126 can be configured to, for example, accumulate the second magnetic variation data 112 with additional magnetic variation data received from one or more additional aircraft. For example, for a plurality of aircraft employing the systems and methods disclosed herein, the magnetic variation data accumulator 126 can accumulate the second magnetic variation data 112 from each aircraft to generate a larger sample of differing magnetic variation data for a particular location, allowing for statistical analysis to validate the differing data. The statistical analysis can generate third magnetic variation data 130, which can be more accurate given the larger sample. In some aspects, the magnetic variation database 104 can be updated based at least on the third magnetic variation data 130.

In some implementations, the computing device 102 can be associated with, integrated into, or otherwise included in an aircraft. The system 100 can also include components not illustrated in FIG. 1. For example, the computing device 102 can also include a receiver configured to receive the first magnetic variation data 124 from the magnetic variation database(s) 104. The receiver can be configured to receive the data, for example, via a computer bus. As an additional example, the system 100 can also include one or more input/output interfaces, one or more network interfaces, etc. Further, although FIG. 1 illustrates the memory 108 of the system 100 as storing certain data, more, fewer, and/or different data can be present within the memory 108 without departing from the scope of the subject disclosure.

Additionally, although FIG. 1 illustrates certain operations occurring within the computing device 102, these operations can be performed by other components of the system 100 without departing from the scope of the subject disclosure. For example, one or more components external to the computing device 102 can be configured to host or otherwise incorporate some or all of the components of the instrument landing system 122. Such component(s) can be located remotely from the computing device 102 and accessed via a modem of the computing device 102.

Further, although FIG. 1 illustrates the computing device 102 and the magnetic variation database(s) 104 as separate, other configurations are possible without departing from the scope of the subject disclosure. For example, the computing device 102 and the magnetic variation database(s) 104 can be integrated into an aircraft's navigational computer. As an additional example, one or more components of the computing device 102 can be distributed across a plurality of computing devices (e.g., a group of processor cores).

Still further, although FIG. 1 illustrates the computing device 102, the magnetic variation database(s) 104, and the magnetic variation data accumulator 126 as separate, other configurations are possible without departing from the scope of the subject disclosure. For example, the computing device 102, the magnetic variation database(s) 104, and the magnetic variation data accumulator 126 can be integrated into an aircraft's navigational computer. As an additional example, one or more components of the magnetic variation data accumulator 126 can be distributed across a plurality of computing devices (e.g., a plurality of different aircraft's navigational computers). As a further example, components of the magnetic variation data accumulator 126 and components of the magnetic variation database(s) 104 can be integrated into one or more electronic devices distinct from the electronic device 102, integrated with the electronic device 102, or some combination thereof.

Figure 2:
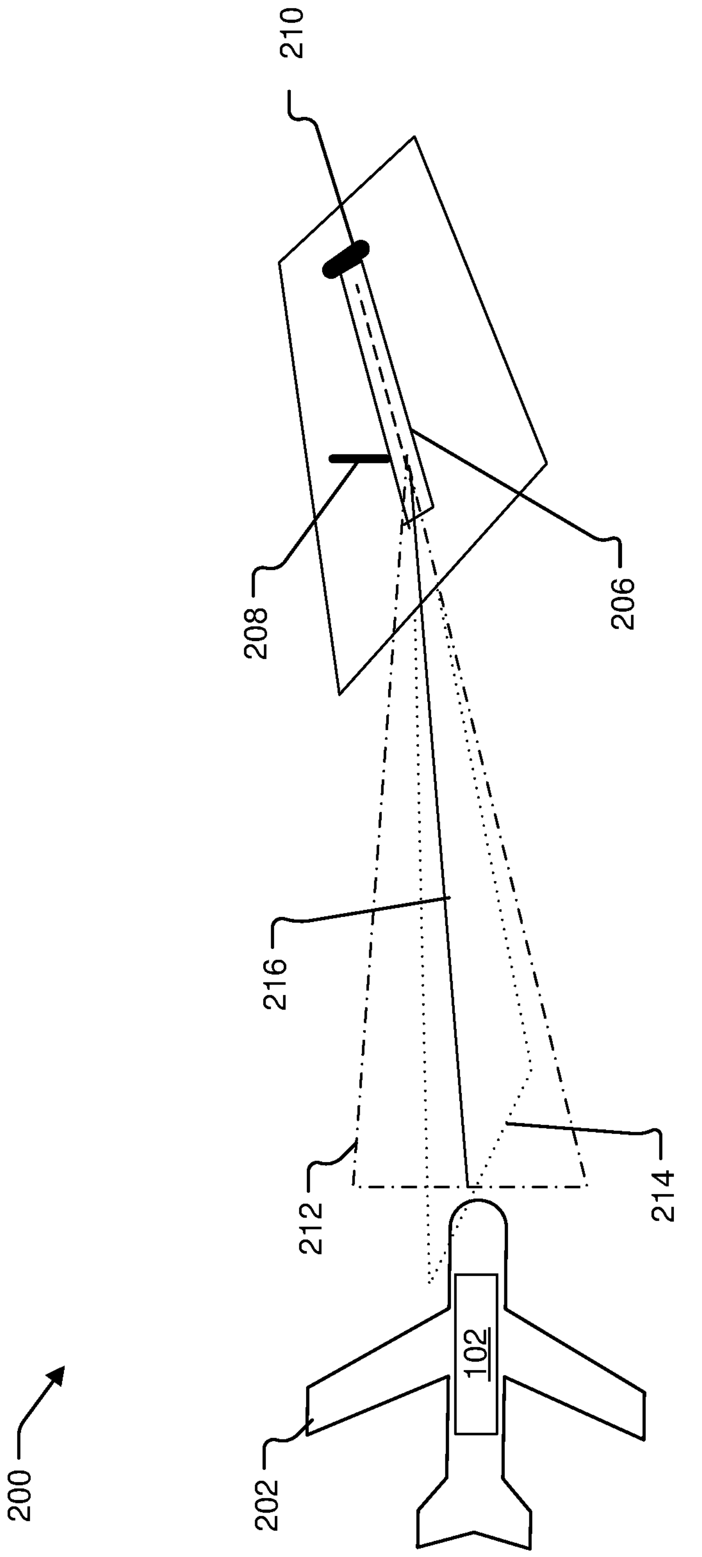
FIG. 2 depicts an example diagram of an airport configured to enable instrument-assisted landings by an aircraft approaching a runway of the airport, in accordance with some implementations of the subject disclosure.

FIG. 2 depicts an example diagram 200 of an airport configured to enable instrument-assisted landings by an aircraft 202 approaching a runway 206 of the airport, in accordance with some implementations of the subject disclosure.

The airport can include one or more glide slope antennas 208 generally located near the runway 206 and configured to transmit signals that provide vertical guidance to the approaching aircraft 202. The glide slope antenna 208 emits a narrow radio beam (e.g., in a range of 329.15-335 MHz) that is angled upwards at a specific angle (e.g., three degrees). The radio beam, transmitted at the specific angle, can be received by the approaching aircraft 202 to provide guidance for a vertical descent path. In the example diagram 200, the vertical range 212 indicates a general range in which the aircraft 202 can use the signal from the glide slope antenna 208 for guidance in an instrument-assisted landing.

The airport can also include one or more localizer antennas ("localizer") 210. The localizer antenna 210 is generally located at the far end of the runway 206 or near the touchdown zone. The localizer antenna 210 emits a narrow radio beam (e.g., in a range of 108.1-111.95 MHz) that transmits at a specific angle (e.g., three to six degrees). The radio beam, transmitted at the specific angle, can be received by the approaching aircraft 202 to provide approach guidance in the horizontal plane. The localizer beam is oriented in line with the runway centerline, and the signal transmitted by the antenna allows the aircraft's onboard receiver to determine whether it is left or right of the desired approach path. In the example diagram 200, the horizontal range 214 indicates a general range in which the aircraft 202 can use the signal from the localizer antenna 210 for guidance in an instrument-assisted landing.

In the example diagram 200, the aircraft 202 attempts to locate the centerline 216 associated with a center of the vertical range 212 and a center of the horizontal range 214. Locating the centerline 216 allows the ILS of the aircraft 202 to know that the approach to the runway 206 is on a centerline from the localizer antenna 210 and on an appropriate glide path as indicated by the glide slope antenna 208.

In some implementations, the aircraft 202 can include the computing device 102 of FIG. 1. As the aircraft 202 flies along the centerline 216 of the signal from the localizer antenna 210, the computing device 102 can be configured to determine the second magnetic variation data 112 based on the published approach data 116 associated with the airport and one or more trajectory measurements 118 associated with the aircraft's 202 current heading. Using the illustrative example of FIG. 1, the aircraft 202 can be configured to identify that a magnetic heading aligned the centerline 216 of the signal from the localizer antenna 210 indicates a magnetic variation of three degrees from true north (e.g., the second magnetic variation data 112 of FIG. 1), as opposed to a magnetic variation of two degrees (e.g., the first magnetic variation data 124 of FIG. 1) as indicated by the magnetic variation database 104 of FIG. 1. If the difference between the first magnetic variation data 124 and the second magnetic variation data 112 satisfies the deviation threshold 120 of FIG. 1, the computing device 102 can be configured to update the magnetic variation database 104 based at least on the second magnetic variation data 112.

Figure 3:
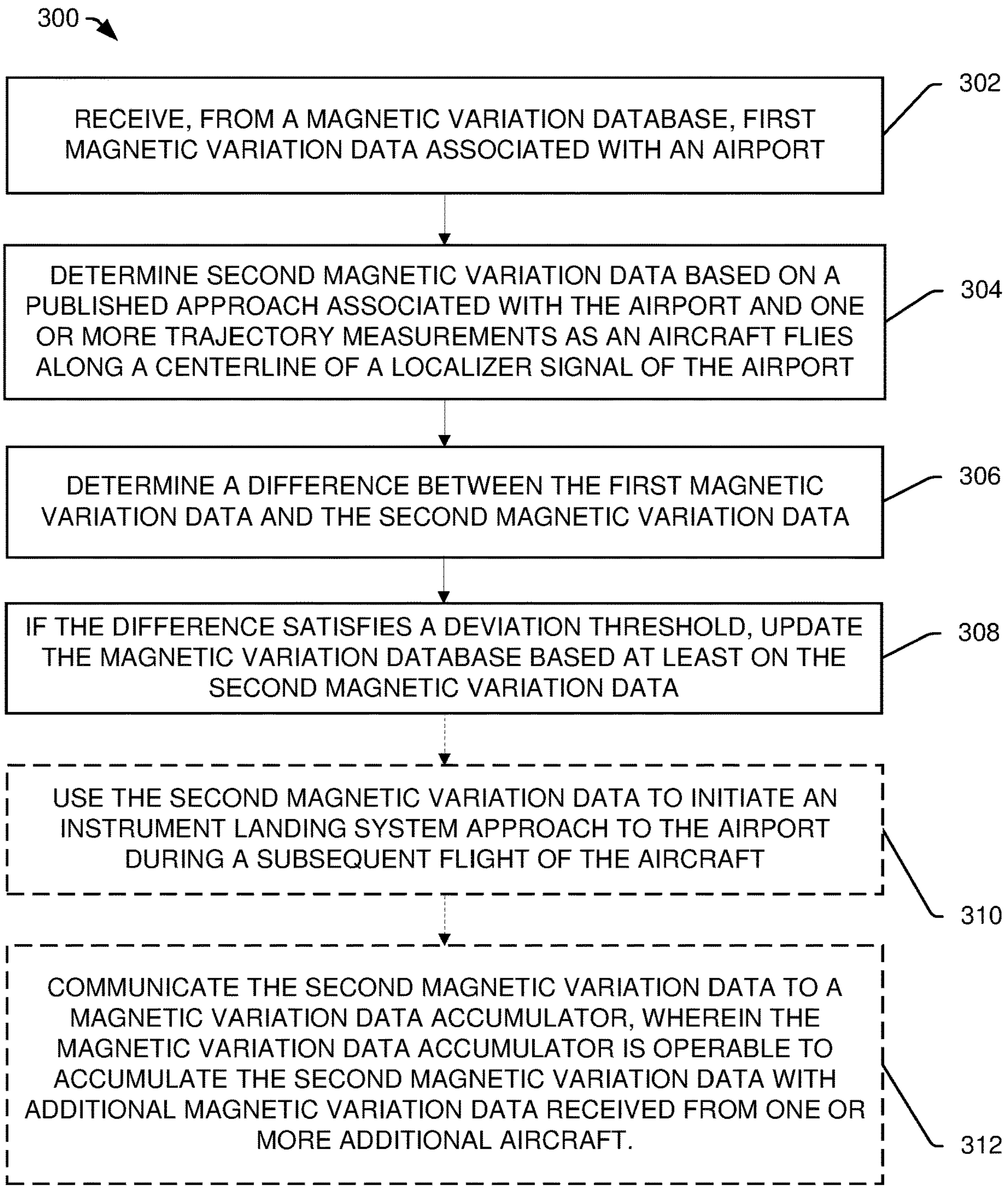
FIG. 3 is a flow chart of an example method for automatic magnetic variation detection, in accordance with some examples of the subject disclosure.

FIG. 3 is a flow chart of an example method 300 for automatic magnetic variation detection, in accordance with some examples of the subject disclosure. The method 300 can be initiated, performed, or controlled by one or more processors executing instructions, such as by the processor(s) 106 of FIG. 1 executing instructions from the memory 108.

In some implementations, the method 300 includes, at 302, receiving, from a magnetic variation database, first magnetic variation data associated with an airport. For example, the processor(s) 106 of FIG. 1 can receive, from the magnetic variation database 104, the first magnetic variation data 124 associated with an airport.

In the example of FIG. 3, the method 300 can also include, at 304, determining second magnetic variation data based on a published approach associated with the airport and one or more trajectory measurements as an aircraft flies along a centerline of a localizer signal of the airport. For example, the processor(s) 106 of FIG. 1 can determine the second magnetic variation data 112 based on the published approach data 116 associated with the airport and one or more trajectory measurements 118 as the aircraft flies along the centerline 216 of FIG. 2 of the signal from the localizer antenna 210 of the airport.

In the example of FIG. 3, the method 300 can also include, at 306, determining a difference between the first magnetic variation data and the second magnetic variation data. For example, the processor(s) 106 of FIG. 1 can determine the difference 114 between the first magnetic variation data 124 and the second magnetic variation data 112. The method 300 can also include, at 308, if the difference satisfies a deviation threshold, updating the magnetic variation database based at least on the second magnetic variation data. For example, the processor(s) 106 of FIG. 1 can update the magnetic variation database 104 based at least on the second magnetic variation data 112 if the difference 114 satisfies the deviation threshold 120.

Although the method 300 is illustrated as including a certain number of steps, more, fewer, and/or different steps can be included in the method 300 without departing from the scope of the subject disclosure. For example, the method 300 can optionally include additional steps, as described in more detail below.

In the example of FIG. 3, the method 300 can also optionally include, at 310, using the second magnetic variation data to initiate an instrument landing system approach to the airport during a subsequent flight of the aircraft. For example, the processor(s) 106 of FIG. 1 can be configured to use the second magnetic variation data 112 to initiate an instrument landing system approach to the airport during a subsequent flight of the aircraft.

In the example of FIG. 3, the method 300 can also optionally include, at 312, communicating the second magnetic variation data to a magnetic variation data accumulator, wherein the magnetic variation data accumulator is operable to accumulate the second magnetic variation data with additional magnetic variation data received from one or more additional aircraft. For example, the processor(s) 106 of FIG. 1 can be configured to communicate the second magnetic variation data 112 to the magnetic variation data accumulator 126, wherein the magnetic variation data accumulator 126 is operable to accumulate the second magnetic variation data with additional magnetic variation data received from one or more additional aircraft.

As noted above, more, fewer, and/or different steps can be included in the method 300 without departing from the scope of the subject disclosure. For example, the method 300 can vary depending on the count and variety of input data received. In a particular configuration, the system 100 of FIG. 1 can be configured to obtain the first magnetic variation data 124, determine the difference 114, and recheck the first magnetic variation data 124 to ensure the first magnetic variation data 124 was accurately received.

Figure 4:
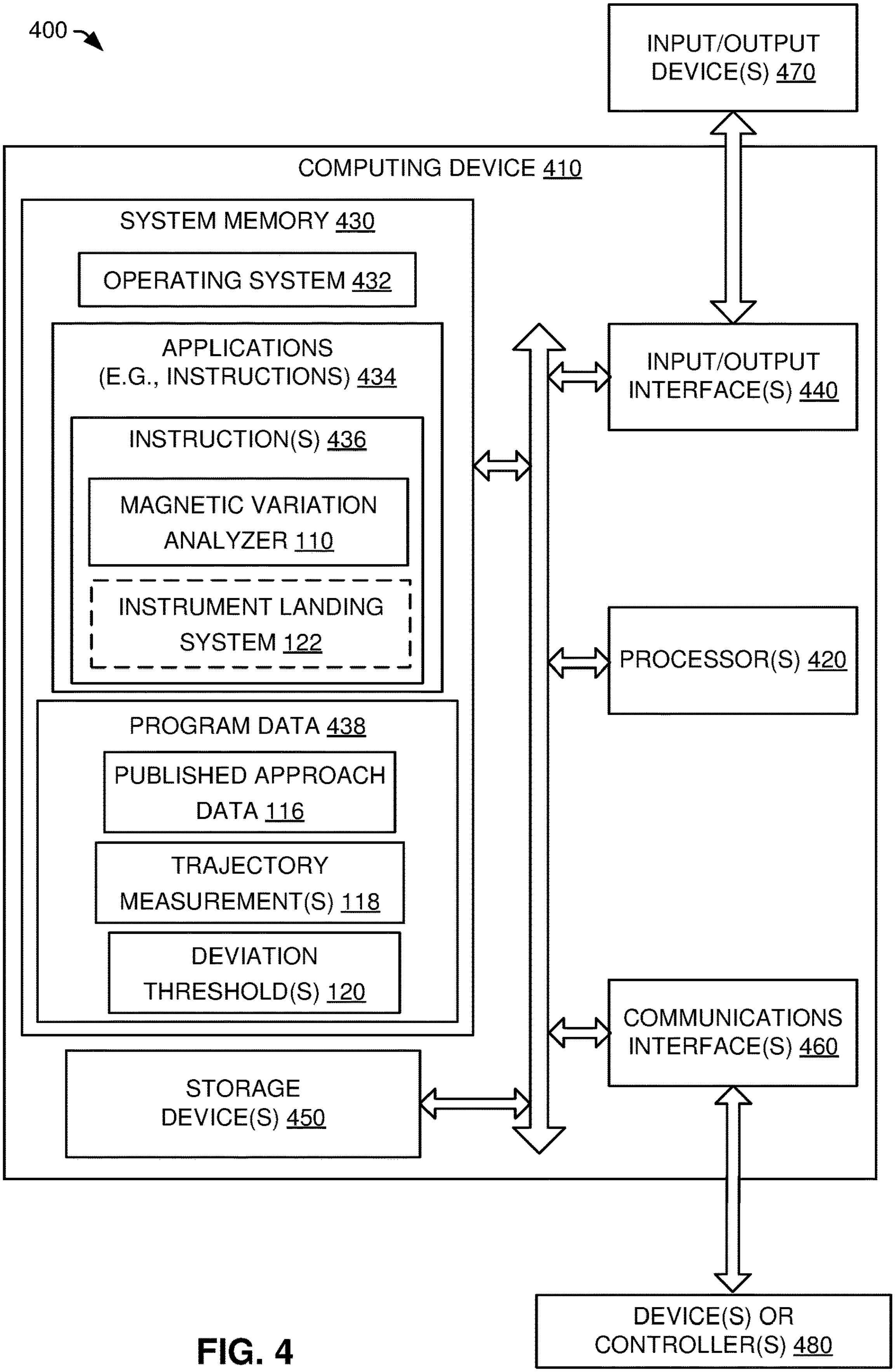
FIG. 4 is a block diagram of a computing environment including a computing device configured to support aspects of computer-implemented methods and computer-executable program instructions (or code), in accordance with some examples of the subject disclosure.

FIG. 4 is a block diagram of a computing environment 400 including a computing device 410 configured to support aspects of computer-implemented methods and computer-executable program instructions (or code), in accordance with some examples of the subject disclosure. For example, the computing device 410, or portions thereof, is configured to execute instructions to initiate, perform, or control one or more operations described in more detail above with reference to FIGS. 1-3. In a particular aspect, the computing device 410 can include, correspond to, or be included within the computing device 102, the magnetic variation database(s) 104, the magnetic variation data accumulator 126 of FIG. 1, one or more servers, one or more virtual devices, or a combination thereof.

The computing device 410 includes one or more processors 420. In a particular aspect, the processor(s) 420 correspond to the processor(s) 106 of FIG. 1. The processor(s) 420 are configured to communicate with system memory 430, one or more storage devices 450, one or more input/output interfaces 440, one or more communications interfaces 460, or any combination thereof. The system memory 430 includes volatile memory devices (e.g., random access memory (RAM) devices), nonvolatile memory devices (e.g., read-only memory (ROM) devices, programmable read-only memory, and flash memory), or both. The system memory 430 stores an operating system 432, which can include a basic input/output system for booting the computing device 410 as well as a full operating system to enable the computing device 410 to interact with users, other programs, and other devices. The system memory 430 stores system (program) data 438, such as the published approach data 116, the trajectory measurement(s) 118, the deviation threshold(s) 120 of FIG. 1, or a combination thereof.

The system memory 430 includes one or more applications 434 (e.g., sets of instructions) executable by the processor(s) 420. As an example, the one or more applications 434 include the instructions 436 executable by the processor(s) 420 to initiate, control, or perform one or more operations described with reference to FIGS. 1-3. To illustrate, the one or more applications 434 include the instructions 436 executable by the processor(s) 420 to initiate, control, or perform one or more operations described with reference to determining the second magnetic variation data 112, determining the difference 114 between the first magnetic variation data 124 and the second magnetic variation data 112, and, if the difference 114 satisfies the deviation threshold 120, updating the magnetic variation database based at least on the second magnetic variation data.

In a particular implementation, the system memory 430 includes a non-transitory, computer readable medium (e.g., a computer-readable storage device) storing the instructions 436 that, when executed by the processor(s) 420, cause the processor(s) 420 to initiate, perform, or control operations for improving an automated environment for aeronautical information services. The operations include receiving, from a magnetic variation database, first magnetic variation data associated with an airport. The operations also include determining second magnetic variation data based on a published approach associated with the airport and one or more trajectory measurements as an aircraft flies along a centerline of a localizer signal of the airport. The operations also include determining a difference between the first magnetic variation data and the second magnetic variation data. The operations also include, if the difference satisfies a deviation threshold, updating the magnetic variation database based at least on the second magnetic variation data.

The one or more storage devices 450 include nonvolatile storage devices, such as magnetic disks, optical disks, or flash memory devices. In a particular example, the storage devices 450 include both removable and non-removable memory devices. The storage devices 450 are configured to store an operating system, images of operating systems, applications (e.g., one or more of the applications 434), and program data (e.g., the program data 438). In a particular aspect, the system memory 430, the storage devices 450, or both, include tangible computer-readable media. In a particular aspect, one or more of the storage devices 450 are external to the computing device 410.

The one or more input/output interfaces 440 enable the computing device 410 to communicate with one or more input/output devices 470 to facilitate user interaction. For example, the one or more input/output interfaces 440 can include a display interface, an input interface, or both. For example, the input/output interface 440 is adapted to receive input from a user, to receive input from another computing device, or a combination thereof. In some implementations, the input/output interface 440 conforms to one or more standard interface protocols, including serial interfaces (e.g., universal serial bus (USB) interfaces or Institute of Electrical and Electronics Engineers (IEEE) interface standards), parallel interfaces, display adapters, audio adapters, or custom interfaces ("IEEE" is a registered trademark of The Institute of Electrical and Electronics Engineers, Inc. of Piscataway, New Jersey). In some implementations, the input/output device(s) 470 include one or more user interface devices and displays, including some combination of buttons, keyboards, pointing devices, displays, speakers, microphones, touch screens, and other devices.

The processor(s) 420 are configured to communicate with devices or controllers 480 via the one or more communications interfaces 460. For example, the one or more communications interfaces 460 can include a network interface. The devices or controllers 480 can include, for example, the magnetic variation database(s) 104 of FIG. 1.

In some implementations, a non-transitory, computer readable medium (e.g., a computer-readable storage device) stores instructions that, when executed by one or more processors, cause the one or more processors to initiate, perform, or control operations to perform part of or all the functionality described above. For example, the instructions can be executable to implement one or more of the operations or methods of FIGS. 1-3. In some implementations, part or all of one or more of the operations or methods of FIGS. 1-3 can be implemented by one or more processors (e.g., one or more central processing units (CPUs), one or more graphics processing units (GPUs), one or more digital signal processors (DSPs)) executing instructions, by dedicated hardware circuitry, or any combination thereof.

In conjunction with the described implementations, an apparatus includes means for receiving, from a magnetic variation database, first magnetic variation data associated with an airport. For example, the means for receiving the first magnetic variation data includes the computing device 102, the processor(s) 106, the magnetic variation database(s) 104 of FIG. 1, one or more other circuits or components configured to receive, from a magnetic variation database, first magnetic variation data associated with an airport, or any combination thereof.

The device also includes means for determining second magnetic variation data based on a published approach associated with the airport and one or more trajectory measurements as an aircraft flies along a centerline of a localizer signal of the airport. For example, the means for determining second magnetic variation data includes the computing device 102, the processor(s) 106, the magnetic variation analyzer 110 of FIG. 1, one or more other circuits or components configured to determine second magnetic variation data based on a published approach associated with the airport and one or more trajectory measurements as an aircraft flies along a centerline of a localizer signal of the airport, or any combination thereof.

The device also includes means for determining a difference between the first magnetic variation data and the second magnetic variation data. For example, the means for determining the difference includes the computing device 102, the processor(s) 106, the magnetic variation analyzer 110 of FIG. 1, one or more other circuits or components configured to determine a difference between the first magnetic variation data and the second magnetic variation data, or any combination thereof.

The device also includes means for updating, if the difference satisfies a deviation threshold, the magnetic variation database based at least on the second magnetic variation data. For example, the means for updating the magnetic variation database includes the computing device 102, the processor(s) 106, the magnetic variation analyzer 110, the magnetic variation database(s) 104 of FIG. 1, one or more other circuits or components configured to update, if the difference satisfies a deviation threshold, the magnetic variation database based at least on the second magnetic variation data, or any combination thereof.

The illustrations of the examples described herein are intended to provide a general understanding of the structure of the various implementations. The illustrations are not intended to serve as a complete description of all of the elements and features of apparatus and systems that utilize the structures or methods described herein. Many other implementations can be apparent to those of skill in the art upon reviewing the disclosure. Other implementations can be utilized and derived from the disclosure, such that structural and logical substitutions and changes can be made without departing from the scope of the disclosure. For example, method operations can be performed in a different order than shown in the figures or one or more method operations can be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results can be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features can be grouped together or described in a single implementation for the purpose of streamlining the disclosure. Examples described above illustrate but do not limit the disclosure. It should also be understood that numerous modifications and variations are possible in accordance with the principles of the subject disclosure. As the following claims reflect, the claimed subject matter can be directed to less than all of the features of any of the disclosed examples. Accordingly, the scope of the disclosure is defined by the following claims and their equivalents.

Further, the disclosure comprises embodiments according to the following examples:

According to Example 1, a method includes receiving, from a magnetic variation database, first magnetic variation data associated with an airport; determining second magnetic variation data based on a published approach associated with the airport and one or more trajectory measurements as an aircraft flies along a centerline of a localizer signal of the airport; determining a difference between the first magnetic variation data and the second magnetic variation data; and if the difference satisfies a deviation threshold, updating the magnetic variation database based at least on the second magnetic variation data.

Example 2 includes the method of Example 1, wherein the deviation threshold is associated with a granularity of the magnetic variation database.

Example 3 includes the method of Example 2, wherein the granularity of the magnetic variation database is within an inclusive range of 0.5-1.0 degrees.

Example 4 includes the method of Example 3, wherein the deviation threshold is within an inclusive range of 0.5-1.0 degrees.

Example 5 includes the method of any of Examples 1 to 4 and further includes using the second magnetic variation data to initiate an instrument landing system approach to the airport during a subsequent flight of the aircraft.

Example 6 includes the method of any of Examples 1 to 5 and further includes communicating the second magnetic variation data to a magnetic variation data accumulator, wherein the magnetic variation data accumulator is operable to accumulate the second magnetic variation data with additional magnetic variation data received from one or more additional aircraft.

Example 7 includes the method of Example 6, and further includes receiving a third magnetic variation data from the magnetic variation data accumulator, wherein the third magnetic variation data is based at least on a statistical analysis of the second magnetic variation data and the additional magnetic variation data.

Example 8 includes the method of Example 7, and further includes updating the magnetic variation database based at least on the third magnetic variation data.

According to Example 9, a device includes one or more processors configured to receive, from a magnetic variation database, first magnetic variation data associated with an airport; determine second magnetic variation data based on a published approach associated with the airport and one or more trajectory measurements as an aircraft flies along a centerline of a localizer signal of the airport; determine a difference between the first magnetic variation data and the second magnetic variation data; and if the difference satisfies a deviation threshold, update the magnetic variation database based at least on the second magnetic variation data.

Example 10 includes the device of Example 9, wherein the deviation threshold is associated with a granularity of the magnetic variation database.

Example 11 includes the device of Example 10, wherein the granularity of the magnetic variation database is within an inclusive range of 0.5-1.0 degrees.

Example 12 includes the device of Example 11, wherein the deviation threshold is within an inclusive range of 0.5-1.0 degrees.

Example 13 includes the device of any of Examples 9 to 12, wherein the one or more processors are further configured to plot a second course for the aircraft based at least on the second magnetic variation data.

Example 14 includes the device of any of Examples 9 to 13, wherein the one or more processors are further configured to communicate the second magnetic variation data to a magnetic variation data accumulator, and wherein the magnetic variation data accumulator is operable to accumulate the second magnetic variation data with additional magnetic variation data received from one or more additional aircraft.

Example 15 includes the device of Example 14, wherein the one or more processors are further configured to receive a third magnetic variation data from the magnetic variation data accumulator, and wherein the third magnetic variation data is based at least on a statistical analysis of the second magnetic variation data and the additional magnetic variation data.

Example 16 includes the device of Example 15, wherein the one or more processors are further configured to update the magnetic variation database based at least on the third magnetic variation data.

Example 17 includes the device of any of Examples 9 to 16, wherein the one or more processors are integrated within a line-replaceable unit of the aircraft.

Example 18 includes the device of any of Examples 9 to 17, wherein the one or more processors are integrated within a ground-based system.

According to Example 19, a non-transitory computer-readable medium comprising instructions that, when executed by one or more processors, cause the one or more processors to receive, from a magnetic variation database, first magnetic variation data associated with an airport; determine second magnetic variation data based on a published approach associated with the airport and one or more trajectory measurements as an aircraft flies along a centerline of a localizer signal of the airport; determine a difference between the first magnetic variation data and the second magnetic variation data; and if the difference satisfies a deviation threshold, update the magnetic variation database based at least on the second magnetic variation data.

Example 20 includes the non-transitory computer-readable medium of Example 19, wherein the deviation threshold is associated with a granularity of the magnetic variation database.

Example 21 includes the non-transitory computer-readable medium of Example 20, wherein the granularity of the magnetic variation database is within an inclusive range of 0.5-1.0 degrees.

Example 22 includes the non-transitory computer-readable medium of Example 21, wherein the deviation threshold is within an inclusive range of 0.5-1.0 degrees.

Example 23 includes the non-transitory computer-readable medium of any of Examples 19 to 22, wherein the one or more processors are further configured to plot a second course for the aircraft based at least on the second magnetic variation data.

Example 24 includes the non-transitory computer-readable medium of any of Examples 19 to 23, wherein the one or more processors are further configured to communicate the second magnetic variation data to a magnetic variation data accumulator, and wherein the magnetic variation data accumulator is operable to accumulate the second magnetic variation data with additional magnetic variation data received from one or more additional aircraft.

Example 25 includes the non-transitory computer-readable medium of Example 24, wherein the one or more processors are further configured to receive a third magnetic variation data from the magnetic variation data accumulator, and wherein the third magnetic variation data is based at least on a statistical analysis of the second magnetic variation data and the additional magnetic variation data.

Example 26 includes the non-transitory computer-readable medium of Example 25, wherein the one or more processors are further configured to update the magnetic variation database based at least on the third magnetic variation data.

According to Example 27, a device includes means for receiving, from a magnetic variation database, first magnetic variation data associated with an airport; means for determining second magnetic variation data based on a published approach associated with the airport and one or more trajectory measurements as an aircraft flies along a centerline of a localizer signal of the airport; means for determining a difference between the first magnetic variation data and the second magnetic variation data; and if the difference satisfies a deviation threshold, means for updating the magnetic variation database based at least on the second magnetic variation data.

Example 28 includes the device of Example 27, wherein the deviation threshold is associated with a granularity of the magnetic variation database.

Example 29 includes the device of Example 28, wherein the granularity of the magnetic variation database is within an inclusive range of 0.5-1.0 degrees.

Example 30 includes the device of Example 29, wherein the deviation threshold is within an inclusive range of 0.5-1.0 degrees.

Example 31 includes the device of any of Examples 27 to 30 and further includes means for using the second magnetic variation data to initiate an instrument landing system approach to the airport during a subsequent flight of the aircraft.

Example 32 includes the device of any of Examples 27 to 31 and further includes means for communicating the second magnetic variation data to a magnetic variation data accumulator, wherein the magnetic variation data accumulator is operable to accumulate the second magnetic variation data with additional magnetic variation data received from one or more additional aircraft.

Example 33 includes the device of Example 32 and further includes means for receiving third magnetic variation data from the magnetic variation data accumulator, wherein the third magnetic variation data is based at least on a statistical analysis of the second magnetic variation data and the additional magnetic variation data.

Example 34 includes the device of Example 33 and further includes means for updating the magnetic variation database based at least on the third magnetic variation data.

What is claimed is:

1. A device comprising:

one or more processors configured to:

receive, from a magnetic variation database, first magnetic variation data associated with an airport;

plot a first course for an instrument landing system of an aircraft, the first course based at least on the first magnetic variation data and associated with an instrument-assisted landing at the airport;

determine second magnetic variation data based on published approach data associated with the airport and one or more trajectory measurements as an aircraft flies along a centerline of a localizer antenna signal of the airport;

determine a difference between the first magnetic variation data and the second magnetic variation data; and if the difference satisfies a deviation threshold, update the magnetic variation database based at least on the second magnetic variation data and plot a second course for the instrument landing system of the aircraft based at least on the second magnetic variation data and associated with the instrument-assisted landing at the airport.

2. The device of claim 1, wherein the deviation threshold is associated with a granularity of the magnetic variation database.

3. The device of claim 2, wherein the granularity of the magnetic variation database is within an inclusive range of 0.5-1.0 degrees.

4. The device of claim 3, wherein the deviation threshold is within an inclusive range of 0.5-1.0 degrees.

5. The device of claim 1, wherein the one or more processors are further configured to communicate the second magnetic variation data to a magnetic variation data accumulator, and wherein the magnetic variation data accumulator is operable to accumulate the second magnetic variation data with additional magnetic variation data received from one or more additional aircraft.

6. The device of claim 5, wherein the one or more processors are further configured to receive a third magnetic variation data from the magnetic variation data accumulator, and wherein the third magnetic variation data is based at least on a statistical analysis of the second magnetic variation data and the additional magnetic variation data.

7. The device of claim 6, wherein the one or more processors are further configured to update the magnetic variation database based at least on the third magnetic variation data.

8. The device of claim 1, wherein the one or more processors are integrated within a line-replaceable unit of the aircraft.

9. A method comprising:

receiving, by a processor, from a magnetic variation database, first magnetic variation data associated with an airport;

plotting, by the processor, a first course for an instrument landing system of an aircraft, the first course based at least on the first magnetic variation data and associated with an instrument-assisted landing at the airport;

determining, by the processor, second magnetic variation data based on published approach data associated with the airport and one or more trajectory measurements associated with the first course as an aircraft flies along a centerline of a localizer antenna signal of the airport;

determining, by the processor, a difference between the first magnetic variation data and the second magnetic variation data; and if the difference satisfies a deviation threshold, updating the magnetic variation database based at least on the second magnetic variation data and plotting a second course for the instrument landing system of the aircraft based at least on the second magnetic variation data and associated with the instrument-assisted landing at the airport.

10. The method of claim 9, wherein the deviation threshold is associated with a granularity of the magnetic variation database.

11. The method of claim 10, wherein the granularity of the magnetic variation database is within an inclusive range of 0.5-1.0 degrees.

12. The method of claim 11, wherein the deviation threshold is within an inclusive range of 0.5-1.0 degrees.

13. The method of claim 9, further comprising communicating the second magnetic variation data to a magnetic variation data accumulator, wherein the magnetic variation data accumulator is operable to accumulate the second magnetic variation data with additional magnetic variation data received from one or more additional aircraft.

14. The method of claim 13, further comprising receiving a third magnetic variation data from the magnetic variation data accumulator, wherein the third magnetic variation data is based at least on a statistical analysis of the second magnetic variation data and the additional magnetic variation data.

15. The method of claim 14, further comprising updating the magnetic variation database based at least on the third magnetic variation data.

16. A non-transitory computer-readable medium comprising instructions that, when executed by one or more processors, cause the one or more processors to:

receive, from a magnetic variation database, first magnetic variation data associated with an airport;

plot a first course for an instrument landing system of an aircraft, the first course based at least on the first magnetic variation data and associated with an instrument-assisted landing at the airport;

determine second magnetic variation data based on published approach data associated with the airport and one or more trajectory measurements associated with the first course as an aircraft flies along a centerline of a localizer antenna signal of the airport;

determine a difference between the first magnetic variation data and the second magnetic variation data; and if the difference satisfies a deviation threshold, update the magnetic variation database based at least on the second magnetic variation data and plot a second course for the instrument landing system of the aircraft based at least on the second magnetic variation data and associated with the instrument-assisted landing at the airport.

17. The non-transitory computer-readable medium of claim 16, wherein the one or more processors are further configured to communicate the second magnetic variation data to a magnetic variation data accumulator, and wherein the magnetic variation data accumulator is operable to accumulate the second magnetic variation data with additional magnetic variation data received from one or more additional aircraft.

18. The non-transitory computer-readable medium of claim 16, wherein the deviation threshold is associated with a granularity of the magnetic variation database.

19. The non-transitory computer-readable medium of claim 18, wherein the granularity of the magnetic variation database is within an inclusive range of 0.5-1.0 degrees.

20. The non-transitory computer-readable medium of claim 19, wherein the deviation threshold is within an inclusive range of 0.5-1.0 degrees.

* * * * *